(12) United States Patent
Tsuda et al.

(10) Patent No.: US 10,361,536 B2
(45) Date of Patent: Jul. 23, 2019

(54) POWER SUPPLY APPARATUS FOR DRIVING LASER DIODE PROVIDED WITH POWER SUPPLY FOR SUPPLYING POWER TO LASER OSCILLATOR

(71) Applicant: Mitsubishi Electric Corporation, Chiyoda-ku (JP)

(72) Inventors: Shingo Tsuda, Chiyoda-ku (JP); Taichiro Tamida, Chiyoda-ku (JP); Takashi Hashimoto, Chiyoda-ku (JP); Takeshi Morimoto, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/563,793

(22) PCT Filed: Feb. 18, 2016

(86) PCT No.: PCT/JP2016/054686
§ 371 (c)(1),
(2) Date: Oct. 2, 2017

(87) PCT Pub. No.: WO2016/167019
PCT Pub. Date: Oct. 20, 2016

(65) Prior Publication Data
US 2018/0097336 A1   Apr. 5, 2018

(30) Foreign Application Priority Data
Apr. 15, 2015 (JP) .................. 2015-083343

(51) Int. Cl.
*H01S 5/042* (2006.01)
*H03L 7/089* (2006.01)
(Continued)

(52) U.S. Cl.
CPC ............ *H01S 5/0428* (2013.01); *H01S 5/042* (2013.01); *H01S 5/06808* (2013.01);
(Continued)

(58) Field of Classification Search
CPC .................................................. H01S 5/0428
See application file for complete search history.

(56) References Cited

U.S. PATENT DOCUMENTS 6,137,816 A * 10/2000 Kinbara .............. H01S 5/02248
372/29.012
6,259,714 B1   7/2001 Kinbara
2012/0212144 A1   8/2012 Hayashi et al.

FOREIGN PATENT DOCUMENTS

JP   08-168259 A   6/1996
JP   11-087817 A   3/1999
(Continued)

OTHER PUBLICATIONS

International Search Report dated Apr. 26, 2016 in PCT/JP2016/054686, filed on Feb. 18, 2016.
(Continued)

*Primary Examiner* — Tod T Van Roy
(74) *Attorney, Agent, or Firm* — Oblon, McClelland, Maier & Neustadt, L.L.P.

(57) ABSTRACT

A power supply apparatus includes a power supply for supplying power to a laser oscillator. A reactor has one end serially connected to the laser oscillator and another end serially connected to the power supply, and a parallel diode configures a closed circuit for serial connection of the laser oscillator and the reactor. A current detector detects a current flowing in the reactor, and a first switching device is connected in parallel to the laser oscillator and drives the laser oscillator with pulses. An energy consumption circuit prefetches a current command value based on a control signal from a controller upon driving the laser oscillator with (Continued)

pulses, and when the current command value is smaller than a current command value of a previous pulse, the energy consumption circuit consumes energy until the current command value reaches a predetermined target current value.

9 Claims, 10 Drawing Sheets

(51) Int. Cl.
    *H01S 5/068* (2006.01)
    *G05B 19/00* (2006.01)
    *H01S 5/40* (2006.01)

(52) U.S. Cl.
    CPC ............ *H03L 7/0895* (2013.01); *G05B 19/00* (2013.01); *H01S 5/4018* (2013.01)

(56) References Cited

FOREIGN PATENT DOCUMENTS

| | | |
|---|---|---|
| JP | 2010-0 15883 A | 1/2010 |
| JP | 2011-138666 A | 7/2011 |
| JP | 2011-243669 A | 12/2011 |
| JP | 2012-174508 A | 9/2012 |
| JP | 2012-178292 A | 9/2012 |
| WO | 2017/094120 A1 | 6/2017 |

OTHER PUBLICATIONS

Office Action dated Mar. 4, 2019 in Chinese Application No. 201680021941.0 (w/English translation).

* cited by examiner

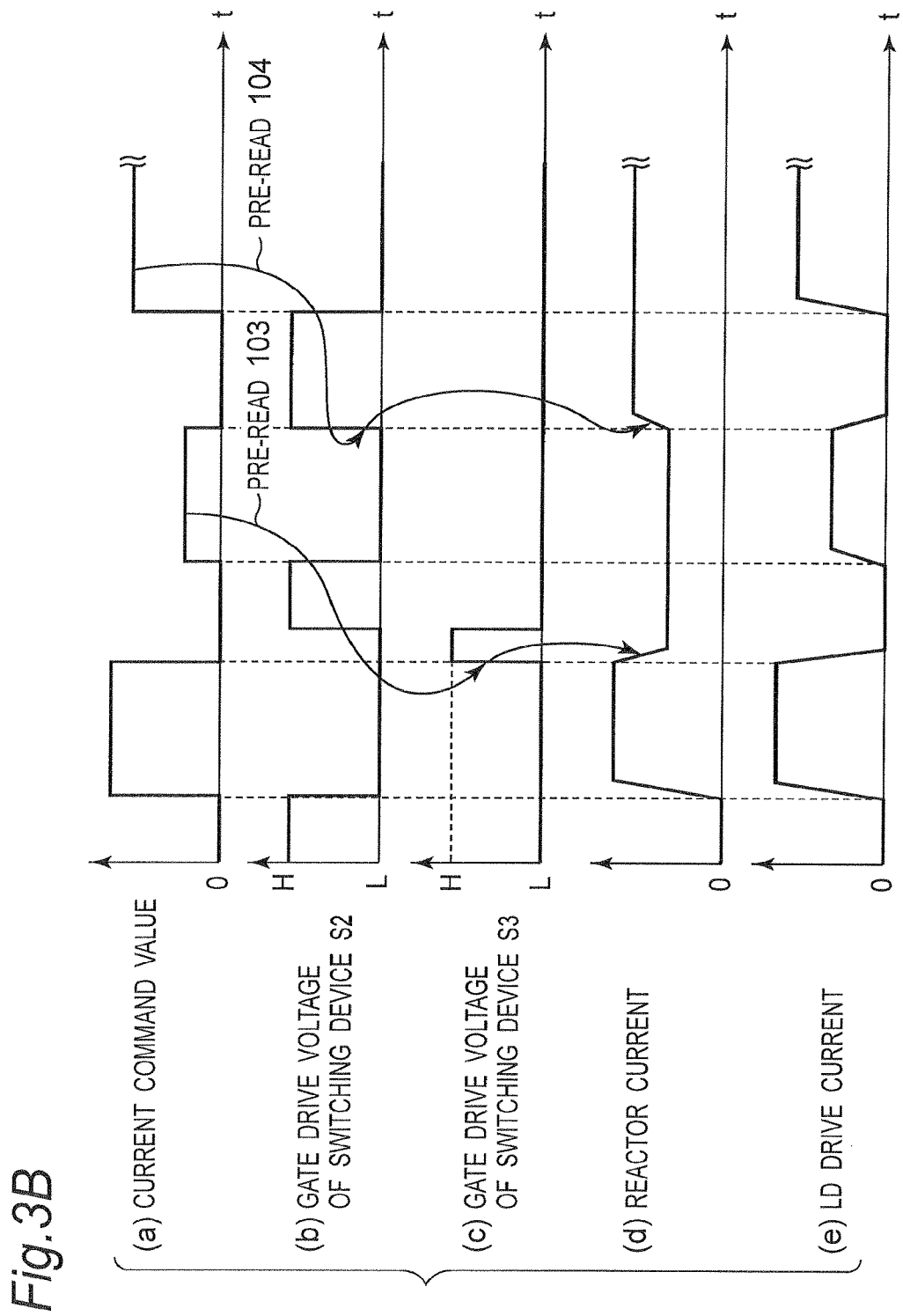

POWER SUPPLY APPARATUS FOR DRIVING LASER DIODE PROVIDED WITH POWER SUPPLY FOR SUPPLYING POWER TO LASER OSCILLATOR

TECHNICAL FIELD

The present invention relates to a power supply apparatus for driving a laser diode.

BACKGROUND ART

In recent years, machining lasers such as semiconductor excitation solid-state lasers and fiber lasers achieve higher power. Consequently, conventional $CO_2$ lasers and YAG lasers are replaced by these semiconductor excitation solid-state lasers and fiber lasers in machining fields of welding, cutting, and marking metal where the $CO_2$ lasers and the YAG lasers have been typically employed. A laser diode (hereinafter, referred to as "LD") is usually employed as a source of oscillating semiconductor excitation lasers. A large number of LDs arranged in serial or parallel in laser machining machines simultaneously emit light for the purpose of achieving higher power. Such an LD array is electrically configured by serially connecting LDs or connecting LD serial circuits in parallel, thus requiring large drive current as a whole.

In addition, the LD is a current driven element, and thus is typically configured as a constant current source circuit, that supplies drive current required to oscillate lasers with desired power as constant current. Such a highly-efficient constant current source circuit employing a switched-mode power supply system typically uses reactors, and thus, if short width laser pulses are to be outputted according to machining conditions, the output current has a low response speed, and cannot be a rectangular wave.

A drive circuit is devised in which a switching device is arranged in parallel to LDs, and is turned on or off to immediately change a current path to the LDs, thus responding to current at a higher speed (for example, see Patent Document 1).

In addition, there is also devised a drive circuit, that forcibly attenuates the output current of a constant current source circuit by causing a resistor to consume the output current to respond to the current at a higher speed (for example, see Patent Documents 2 and 3).

PRIOR ART DOCUMENTS

Patent Documents

[Patent Document 1] Japanese Patent Laid-open Publication No. JPH11-87817A
[Patent Document 2] Japanese Patent Laid-open Publication No. JP2010-015883A
[Patent Document 3] Japanese Patent Laid-open Publication No. JP2011-243669A

SUMMARY OF THE INVENTION

Problems to be Solved by the Invention

In power supply apparatuses for driving an LD described above, if desired current sets according to machining conditions are the same as those for respective pulses, it is possible to turn on and off a beam at a higher speed. However, if the set currents different from each other for respective pulses, the current cannot change at a higher speed because of reactors included in constant current source circuits, and thus, it is impossible to obtain the desired current.

In order to solve the above problems, an object of the present invention is to provide a power supply apparatus for driving an LD, and a control method of the power supply apparatus for driving an LD, that follow current at a higher speed even when currents different from each other for respective pulses are set.

According to the present invention, there is provided a power supply apparatus for driving a laser diode, and the power supply apparatus includes a power supply for supplying power to a laser oscillator including a laser diode. The power supply apparatus includes a reactor, a parallel diode, a current detection means, a first switching device, and an energy consumption means. The reactor has one end serially connected to the laser oscillator and another end serially connected to the power supply, and the parallel diode configures a closed circuit for serial connection of the laser oscillator and the reactor, and the current detection means detects a current flowing in the reactor. The first switching device is connected in parallel to the laser oscillator, and drives the laser oscillator with pulses, and the energy consumption means consumes energy in the reactor. The energy consumption means prefetches a current command value based on a control signal from a controller at a time of driving the laser oscillator with pulses, and when the current command value is smaller than a current command value of a previous pulse, the energy consumption means consumes energy until the current command value reaches a predetermined target current value.

Effects of the Invention

According to the power supply apparatus for driving an LD, and the control method of the power supply apparatus for driving an LD of the present invention, a load that immediately consumes energy accumulated in a reactor is provided, and thus laser power is pulsed at 1 to a few kHz according to machining purposes. Even when the currents different from each other for respective pulses are set, it is possible to follow LD drive current at a higher speed. This enables conditions for a laser machining machine to be switched over at a higher speed, thus achieving a short waiting time and improved productivity.

BRIEF DESCRIPTION OF THE DRAWINGS

FIG. 3B is a timing chart of signals, showing a second example of the pulse current drive in the power supply apparatus for driving an LD in FIG. 1.

MODES FOR CARRYING OUT THE INVENTION

Figure 1:
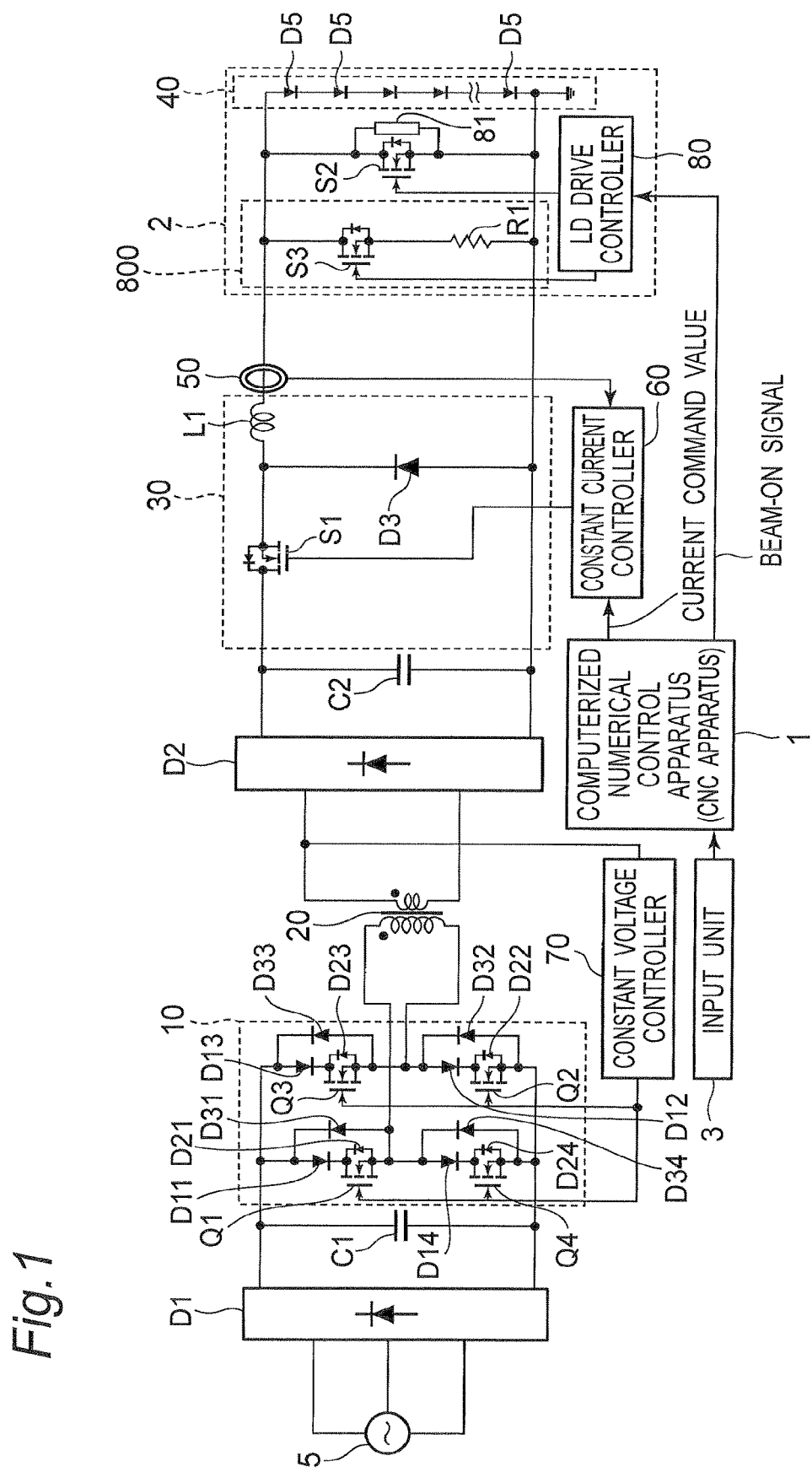
FIG. 1 is a block diagram showing a configuration of a power supply apparatus for driving an LD according to a first embodiment of the present invention.

Embodiments of the present invention are described below with reference to the drawings. It is noted that like reference numerals denote like constituent elements in the following embodiments.

First Embodiment

FIG. 1 is a block diagram showing a configuration of a power supply apparatus for driving an LD according to a first embodiment of the present invention. The power supply apparatus according to the first embodiment is, for example, a power supply apparatus that supplies power to laser diodes in a laser machining machine to drive the laser diodes and that controls a laser diode circuit (hereinafter, referred to as "LD circuit") 40 configured by a serial circuit of a plurality of LDs D5 in a laser oscillator 2. In particular, in the power supply apparatus for driving an LD according to the present embodiment, a user inputs an optimum machining condition for a machining target in advance to a computerized numerical controller (hereinafter, referred to as "CNC apparatus") 1 through an input unit 3. Additionally, the power supply apparatus for driving an LD includes energy consumption means that immediately consumes energy accumulated in a reactor L1 in a constant current source circuit. In particular, the present embodiment exemplifies a serial circuit of a switching device S3, and a power consuming resistor R1 as the energy consumption means, and further includes an LD drive controller 80, that controls the switching device S3 based on a control signal such as a beam-on signal from the CNC apparatus 1.

Figure 4:
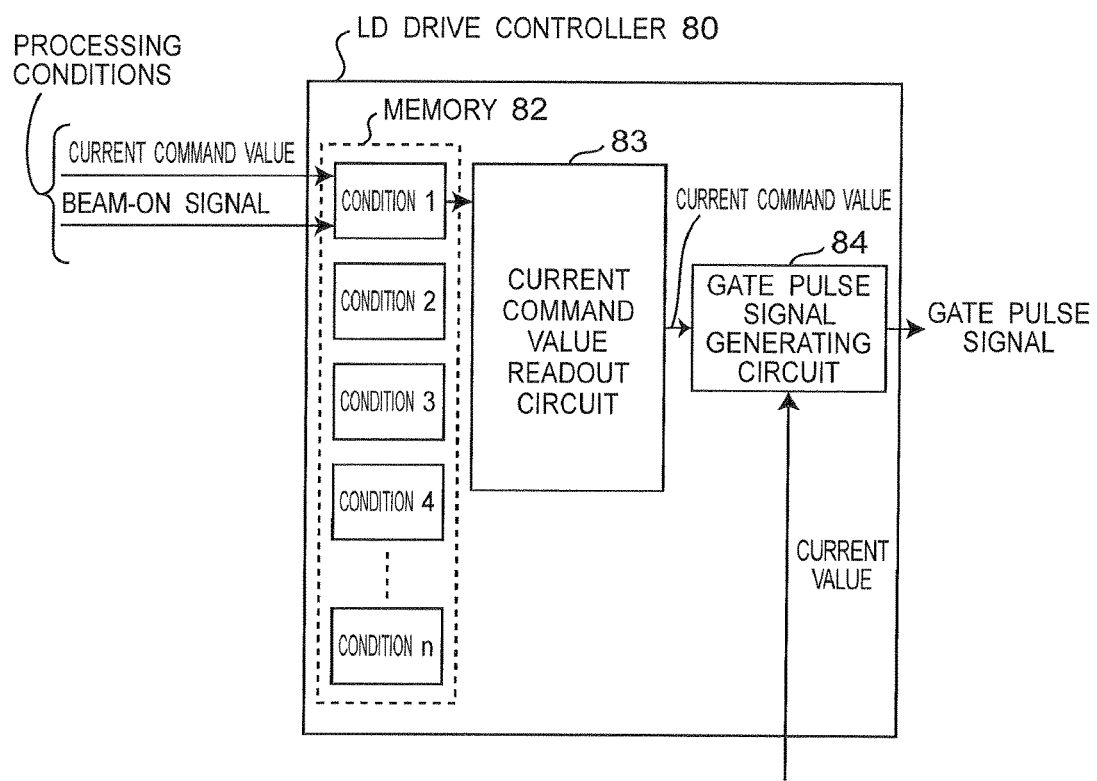
FIG. 4 is a block diagram showing a configurational example of an LD drive controller 80 in FIG. 1.

The LD drive controller 80 in FIG. 4 is mounted with a memory 82 that reads machining conditions (a beam-on timing and current command information) from the CNC apparatus 1, and stores the machining conditions therein in advance. As the current value of the next beam-on pulse is prefetched from the memory 82 during each pulse pause, energy in the reactor L1 is consumed at a higher speed. Consequently, it is possible to change drive current for driving the LD circuit 40 to a desired current value at a higher speed than a speed in prior art.

The power supply apparatus is configured by including a rectifying unit D1 that rectifies AC voltage from, for example, a commercial 200V three-phase AC power supply 5 to rectified voltage, a smoothing capacitor C1 that smoothes the rectified voltage to obtain DC voltage, an inverter unit 10 including a plurality of switching devices Q1 to Q4 for the purpose of converting the DC voltage into high-frequency voltage, a step-down transformer unit 20 that reduces the high-frequency voltage to low voltage, a rectifying unit D2 that rectifies the reduced AC voltage to rectified voltage, a smoothing capacitor C2 that smoothes the rectified voltage to DC voltage, and a step-down chopper unit 30 that supplies the smoothed DC voltage to the LD circuit 40 as constant current.

In the inverter unit 10, a constant voltage controller 70 executes constant voltage control so that DC voltage from the smoothing capacitor C2 is constant. In step-down chopper unit 30 includes a current control switching device S1, a reflux diode D3, and the reactor L1. The step-down chopper unit 30 detects current flowing in the reactor L1 by a current detection unit 50 configured by a CT (Current Transformer), and feeds a detected signal indicating a detected current value back to an error comparator of a constant current controller 60. The constant current controller 60 compares the current value of the detected signal with a current command value set in a command unit of the CNC apparatus 1 to execute feedback control, thus driving the current control switching device S1 to supply the same current as the current command value.

It is noted that an inductance of the reactor L1 is selected to be an appropriate value so as to prevent large ripple current. In addition, diodes D11 to D14 serially connected to the switching devices Q1 to Q4 of the inverter unit 10 and first recovery diodes D21 to D24 and D31 to D34 reversely connected to the switching devices Q1 to Q4 in parallel may be omitted when the switching devices Q1 to Q4 have excellent switching characteristics. It is preferable to use a switching device such as a MOS (Metal-Oxide Semiconductor) field effect transistor (MOSFET), that has forward voltage lower than forward voltage of the reflux diode D3 instead of the switching devices Q1 to Q4 to achieve synchronous rectification. The synchronous rectification enables higher efficiency.

In the power supply apparatus, a switching device S2 is connected in parallel to the LD circuit 40 to cause drive current of the LD circuit 40 to rise or fall at a higher speed for the purpose of turning on or off a laser. At the time of pulse drive, the LD drive controller 80, that controls the switching devices S2 and S3 turns on or off the switching device S2 to selectively switch over the path of the constant current flowing in the reactor L1 to the LD circuit 40 or to the switching device S2. The current of the LD circuit 40 can thus fall at a higher speed by immediately switching over the path of the constant current.

It is noted that, when the drive current of the LD circuit 40 is large, a predetermined snubber circuit 81 may be further disposed in parallel to the switching device S2 to prevent surge voltage generated when the switching device S2 is turned off. For example, it is possible to use, as the snubber circuit 81, an RC snubber circuit that is a serial circuit of a resistor and a capacitor or an RCD snubber circuit configured by connecting diodes in parallel to the resistor or the capacitor of the serial circuit.

However, in large machines such as a laser machining machine, a power supply apparatus is usually disposed to be away from the laser oscillator 2 as shown in FIG. 1, and a wire between the switching device S2 and the LID circuit 40 is long, so that it is difficult to cause the current to fall at a higher speed because of the parasitic impedance of the wire. In the power supply apparatus according to the present embodiment, the switching device S2 is arranged near the LD circuit 40 in the laser oscillator 2, so that the LD circuit 40 and the switching device S2 configure a module of the laser oscillator 2, for the purpose of minimizing the delay time caused by the parasitic impedance of the wire. In addition, it is also possible to configure a module by the LD circuit 40 and the switching device S2 in second to fifth embodiments. It is possible to configure a module by the LD circuit 40 and the switching devices S2 and S3. It is also possible to configure a module by the LD circuit 40 and the switching devices S2 and S3 in the third embodiment.

Figure 2:
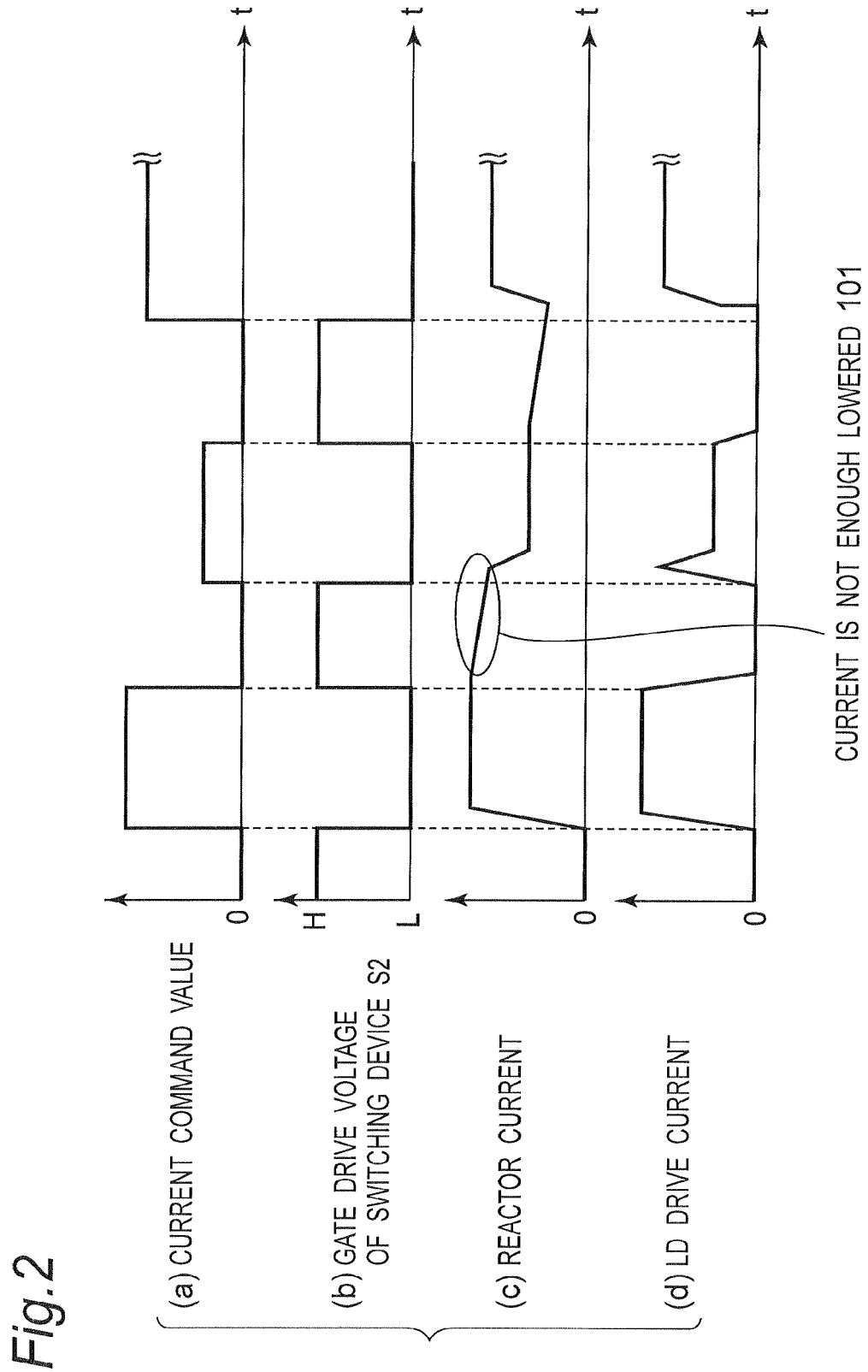
FIG. 2 is a timing chart of signals, showing an example of pulse current drive in a power supply apparatus for driving an LD according to a comparison example.

FIG. 2 is a timing chart of signals, showing an example of pulse current drive in a power supply apparatus for driving an LD according to a comparison example. As shown in FIG. 2, upon outputting the currents different from each other for respective pulses at the time of pulse drive, where a laser is repeatedly turned on and off, when the switching device S2 is turned on during a period when the current command value of a pulse is zero, current flowing in the reactor L1 flows in a closed circuit including a path of the switching device S2 and the reflux diode D3. Large resistor is not present between the switching device S2 and the reflux diode D3, and thus the current reduces depending on only the time determined by the internal impedance and inductance of the reactor L1, the switching device S2, and the reflux diode D3. When the current command value of the next laser on-pulse is smaller than that of the previous pulse, energy accumulated in the reactor L1 is not consumed, and thus current larger than the set command current is momentarily outputted. In particular, the current value of a laser pulse usually changes according to a machined shape in a laser machining machine, and thus such a laser beam may result in inferior machining.

Consequently, in the power supply apparatus according to the present embodiment, as shown in FIG. 1, the switching device S3 and the power consuming resistor R1 are connected, as energy consumption means 800, in parallel to the LD circuit 40 in the laser oscillator 2. The LD drive controller 80 is characterized to control the switching devices S2 and S3 as follows.

Figure 3A:
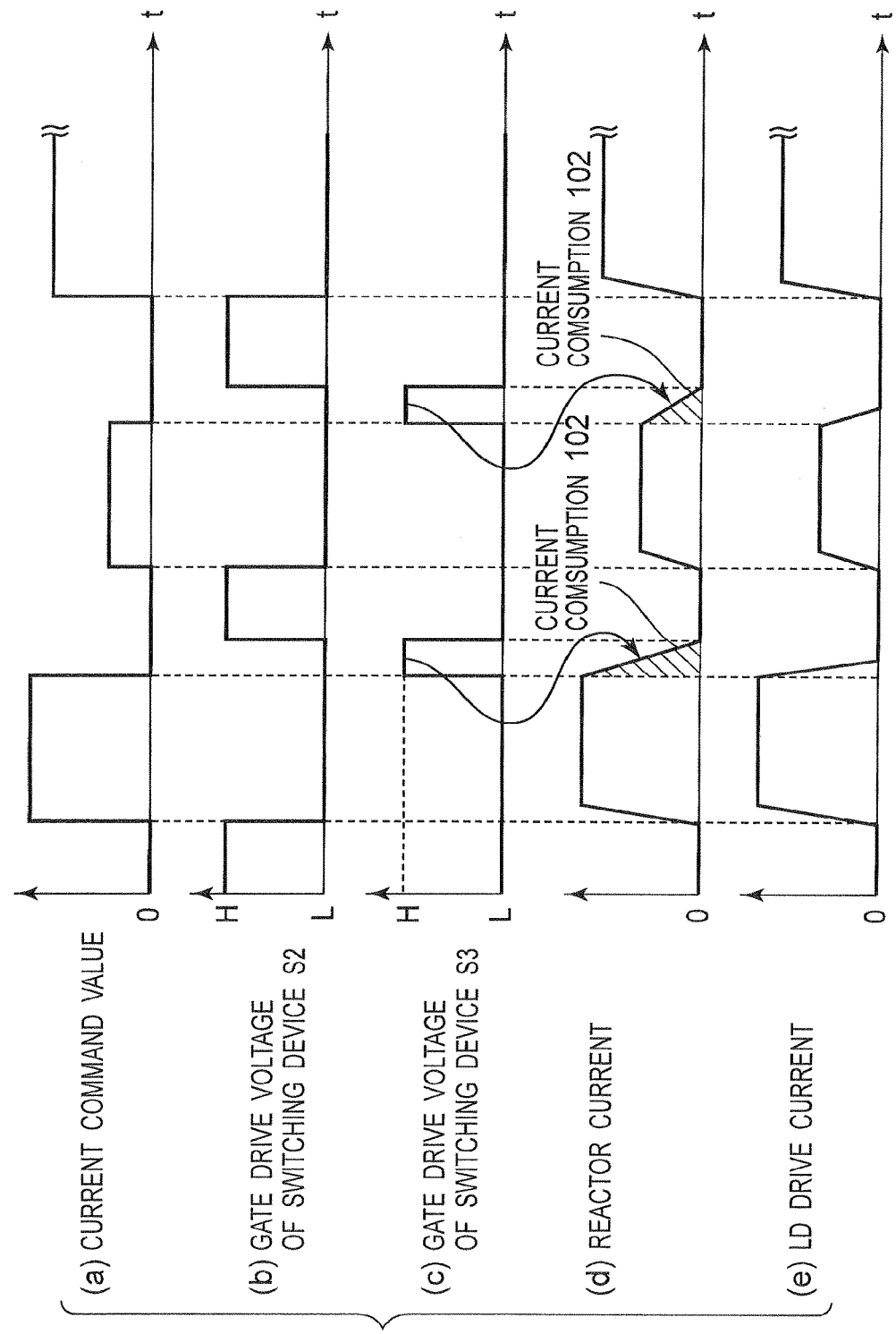
FIG. 3A is a timing chart of signals, showing a first example of pulse current drive in the power supply apparatus for driving an LD in FIG. 1.

FIG. 3A is a timing chart of signals, showing a first example of pulse current drive in the power supply apparatus for driving an LD in FIG. 1. As shown in FIG. 3A, the LD drive controller 80 turns on the switching device S3 for a predetermined pulse period when a beam is off to cause the energy consumption means 800 to consume energy accumulated in the reactor L1 (102) for the purpose of reducing the current at a higher speed. It is thus possible to follow a current command value at a higher speed even when current command values different from each other for respective pulses are set.

It is noted that, if the switching device S3 keeps an on-state, loss in the power consuming resistor R1 is large. Consequently, the LD drive controller 80 turns off the switching device S3, and turns on the switching device S2 after energy consumption, thus minimizing the loss in the power consuming resistor R1. If an element having reduced on resistance is used for the switching device S2, it is possible to further reduce the loss when the beam is off.

In addition, the power supply apparatus according to the present embodiment can control a timing of driving the switching device S2 and the switching device S3 according to a machining condition. For example, in a laser machining machine, a user inputs an optimum machining condition for a machining target in advance to the CNC apparatus 1 through the input unit 3 to program what timing a current command value is changed according to a shape of a workpiece. As shown in FIG. 4, the LD drive controller 80 reads machining conditions 1 to "n" (current command values and beam-on signals) in advance from the CNC apparatus 1, stores the machining conditions in the internal memory 82, and prefetches a current command value at the next beam-on timing from a current command-value readout circuit 83, thus driving the switching device S2 and the switching device S3 by a gate pulse signal generated by a gate pulse signal generating circuit 84.

FIG. 3B is a timing chart of signals, showing a second example of the pulse current drive in the power supply apparatus for driving an LD in FIG. 1. As shown in FIG. 3B, the LD drive controller 80 prefetches a current command value (103 and 104) based on information programmed by a user as described above, and when the current command value of the next laser pulse is smaller than that of the previous pulse (103), the LD drive controller 80 turns on the switching device S3 and detects current flowing in the reactor L1 using the current detection unit 50. The energy in the reactor L1 is consumed until the current command value reaches a predetermined target current command value, and then the switching device S2 is turned on. It is noted that, when the current command value of the next laser pulse is larger than that of the previous pulse (104), the switching device S2 is turned on and the current command value is changed when the pulse is off.

As shown in FIGS. 3A and 3B, as the time when the switching device S2, and the switching device S3 are turned on is controlled to consume energy until the current command value reaches the current command value of the next laser pulse, the laser pulse can rise or fall at a higher speed.

As described above, according to the first embodiment, as the load of the power consuming resistor R1 consumes the energy accumulated in the reactor L1, a current command value can be switched over at a higher speed at the time of pulse drive.

It is noted that, while the LD drive controller 80 prefetches a current command value that is a machining condition from the CNC apparatus 1 in the present embodiment, the CNC apparatus 1 may prefetch the current command value. In such a case, the memory function is not required in the LD drive controller 80. That is, the CNC apparatus 1 may compare the present current command value with a current command value after a pause, and transmit a signal for driving the switching device S3 when the current command value is smaller than that of the previous pulse.

Second Embodiment

Figure 5:
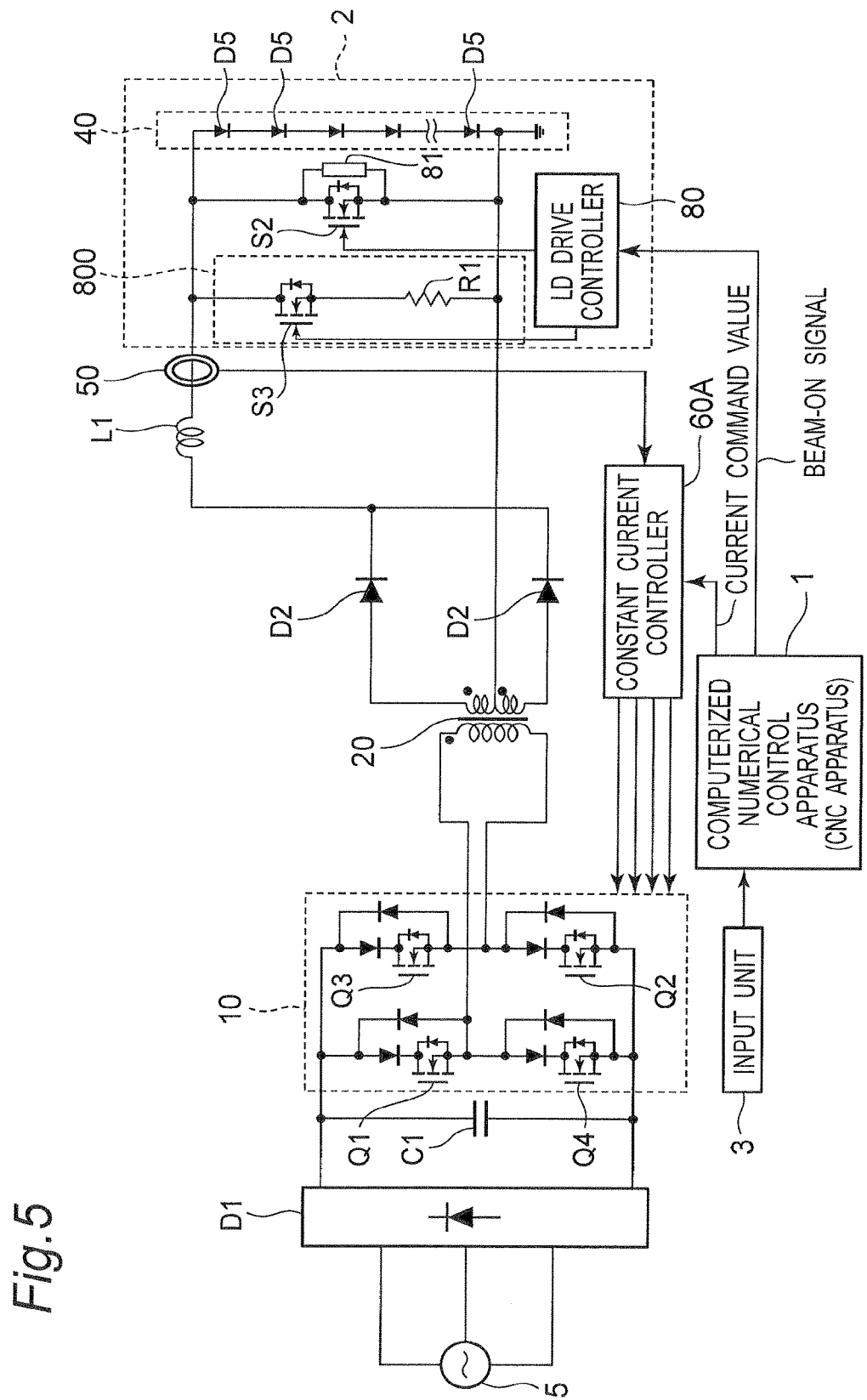
FIG. 5 is a block diagram showing a configuration of a power supply apparatus for driving an LD according to a second embodiment of the present invention.

FIG. 5 is a block diagram showing a configuration of a power supply apparatus for driving an LD according to a second embodiment of the present invention. The power supply apparatus for driving an LD according to the second embodiment is different from the power supply apparatus for driving an LD according to the first embodiment in FIG. 1 in the following points.

(1) The step-down chopper unit 30 including the switching device S1 and the reflux diode D3 is omitted.

(2) A constant current controller 60A is provided instead of the constant current controller 60.

These differences are described below.

When laser power is small and power supply capacity is also small, as shown in FIG. 5, the step-down chopper unit 30 may be omitted to downsize a circuit. The constant current controller 60A executes PWM control on switching devices Q1 to Q4 in an inverter unit 10 based on current detected by a current detection unit 50 so that current flowing in a reactor L1 is constant, thus configuring a constant current source circuit.

In addition if the leakage inductance of a step-down transformer unit 20 is used instead of the reactor L1, the reactor L1 may be omitted.

As described above, the power supply apparatus according to the second embodiment includes a switching device S2 connected in parallel to an LD circuit 40 in the laser oscillator 2, and further includes energy consumption means 800 connected in parallel to the LD circuit 40 and the switching device S2, similarly to the first embodiment. Specifically, the power supply apparatus includes a switching device S3 and a power consuming resistor R1 as the energy consumption means 800, and thus can follow a current command value even when current command values different from each other for respective pulses are set.

It is noted that the configuration of the second embodiment may also be applied to the third to fifth embodiments.

Third Embodiment

Figure 6:
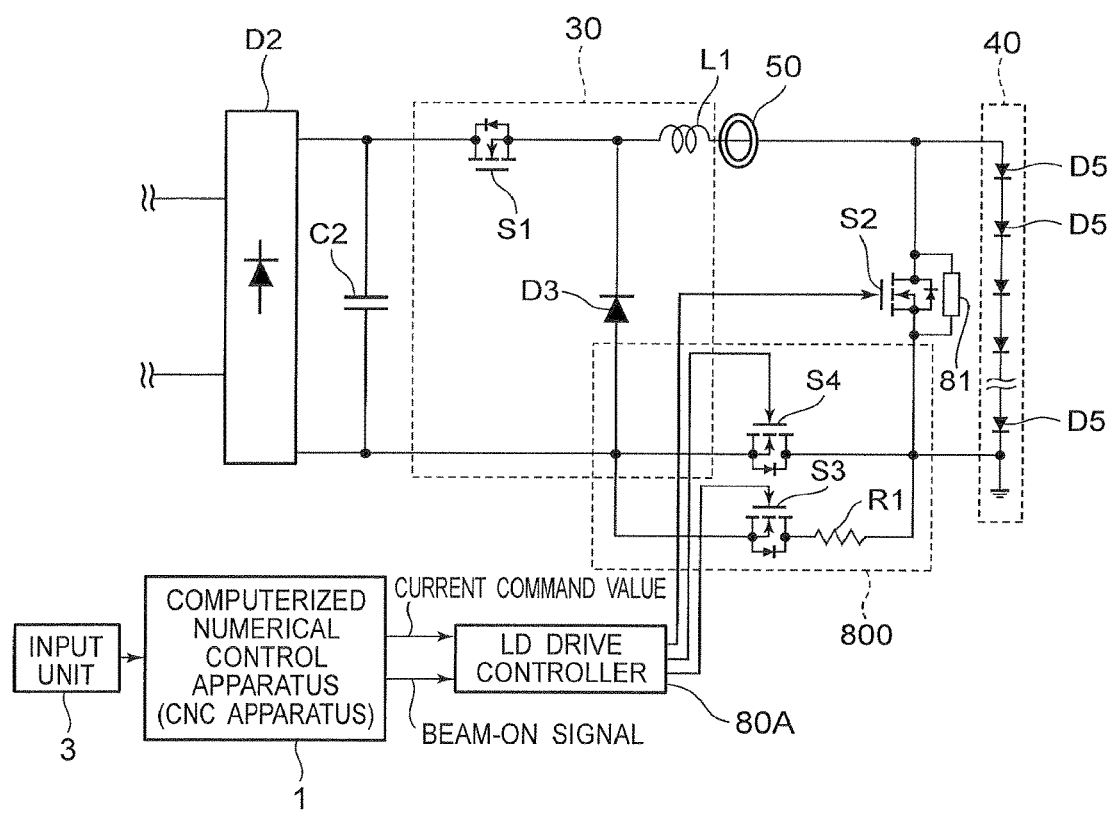
FIG. 6 is a block diagram showing a configuration of a power supply apparatus for driving an LD according to a third embodiment of the present invention.

FIG. 6 is a block diagram showing a configuration of a power supply apparatus for driving an LD according to a third embodiment of the present invention. In the first and second embodiments, the switching device S3 and the power consuming resistor R1 in the laser oscillator 2 are connected in parallel to the LD circuit 40. The power supply apparatus for driving an LD according to the third embodiment is different from the power supply apparatus according to the first embodiment in the following points.

(1) As shown in FIG. 6, a switching device S3 and a power consuming resistor R1 that function as energy consumption means 800 are serially connected to an LD circuit 40.

(2) A switching device S4 is connected in parallel to a serial circuit of the switching device S3 and the power consuming resistor R1 that configure the energy consumption means 800.

(3) An LD drive controller 80A that controls the switching devices S2, S3, and S4 is provided instead of the LD drive controller 80.

These differences are described below.

As in the first and second embodiments, when the power consuming resistor R1 is connected in parallel to the LD circuit 40, it is necessary to select a resistance value so that the voltage across the power consuming resistor generated when the switching device S3 is turned on is not larger than or equal to the forward voltage of the LD circuit 40 for the purpose of preventing current from flowing in LDs when a beam is off. However, when the power consuming resistor R1 is serially connected to the LD circuit 40, the resistance value of the power consuming resistor R1 may be larger than those of the power consuming resistors R1 according to the first and second embodiments. Consequently, it is possible to consume energy in the reactor L1 at a higher speed than the speeds in the first and second embodiments.

Also in the configuration of the third embodiment, control is executed as shown in FIG. 3B. That is, a current command value is prefetched in advance, and when this current command value of the next laser pulse is smaller than that of the previous pulse at the time of pulse drive, the switching device S2 and the switching device S3 are turned on to consume energy. It is thus possible to follow a current command value at a higher speed even when current command values different from each other for respective pulses are set.

It is noted that, if the switching device S3 keeps an on-state, loss in the power consuming resistor R1 is large. Consequently, the switching device S3 is turned off and the switching device S4 is turned on after energy consumption, thus minimizing the loss in the power consuming resistor R1. If an element having reduced on resistance is used for the switching device S4, it is possible to further reduce the loss when the beam is off.

Fourth Embodiment

Figure 7:
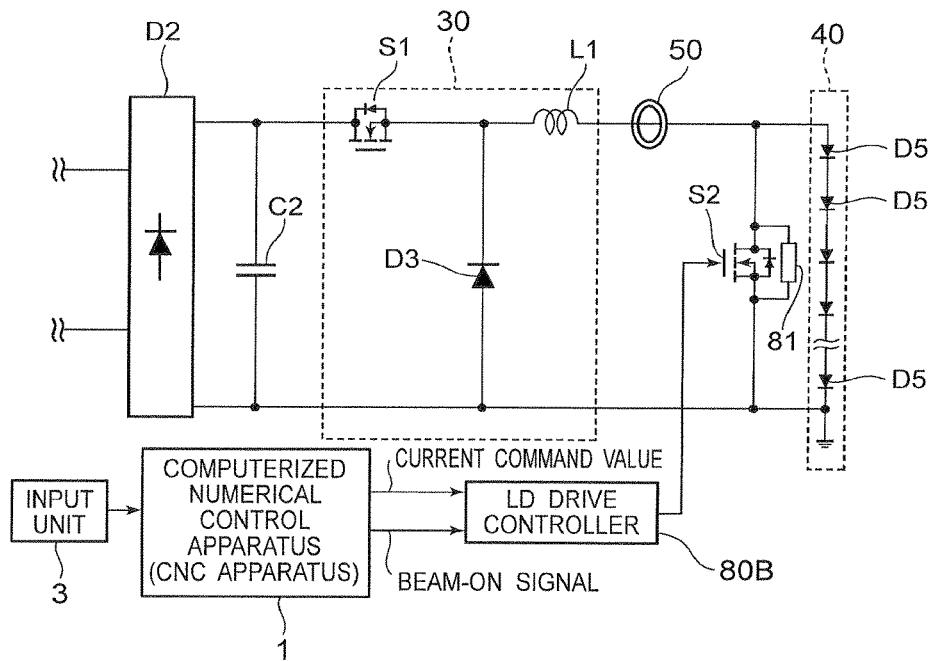
FIG. 7 is a block diagram showing a configuration of a power supply apparatus for driving an LD according to a fourth embodiment of the present invention.
Figure 8:
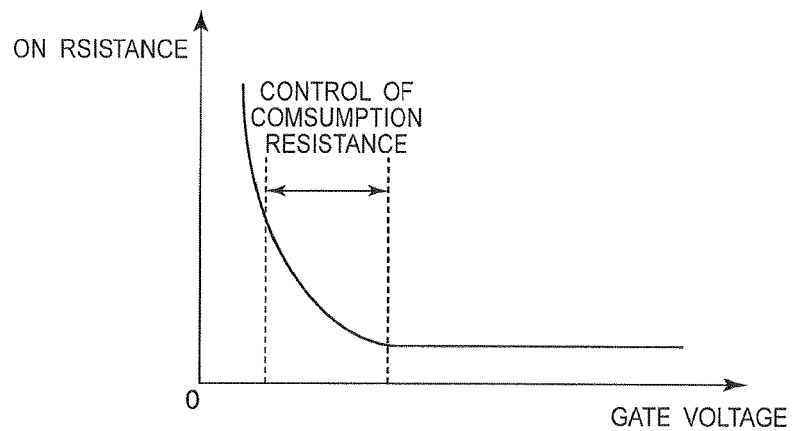
FIG. 8 is a graph showing a relationship between gate voltage and on resistance when a switching device S2 in FIG. 7 is configured by a MOS field effect transistor.

FIG. 7 is a block diagram showing a configuration of a power supply apparatus for driving an LD according to a fourth embodiment of the present invention. In addition, FIG. 8 is a graph showing a relationship between gate voltage and on resistance when a switching device S2 in FIG. 7 is configured by a MOS field effect transistor. The power supply apparatus for driving an LD according to the fourth embodiment is different from the power supply apparatus for driving an LD according to the first embodiment in FIG. 1 in the following points.

(1) The switching device S2 is configured by a MOS field effect transistor.

(2) The switching device S3 and the power consuming resistor R1 are omitted.

(3) An LD drive controller 80B that controls on and off of the switching device S2 is provided instead of the LD drive controller 80.

These differences are described below.

In the first to third embodiments, the switching device S3 and the power consuming resistor R1 are added as the energy consumption means 800, and the power consuming resistor R1 consumes energy accumulated in a reactor. However, when the on resistance of the switching device S2 can be controlled as shown in FIG. 8, the switching device S3 and the power consuming resistor R1 may be omitted and the switching device S2 may be used as the energy consuming means. For example, when an MOSFET is used for the switching device S2, the relationship between the gate voltage and the on resistance has a characteristic shown in FIG. 8. Thus, if the gate voltage of the switching device S2 is reduced when a beam is turned off, it is possible to reduce current at a higher speed by consuming energy accumulated in the reactor L1. That is, the switching device S2 can operate as the energy consumption means 800.

Figure 9:
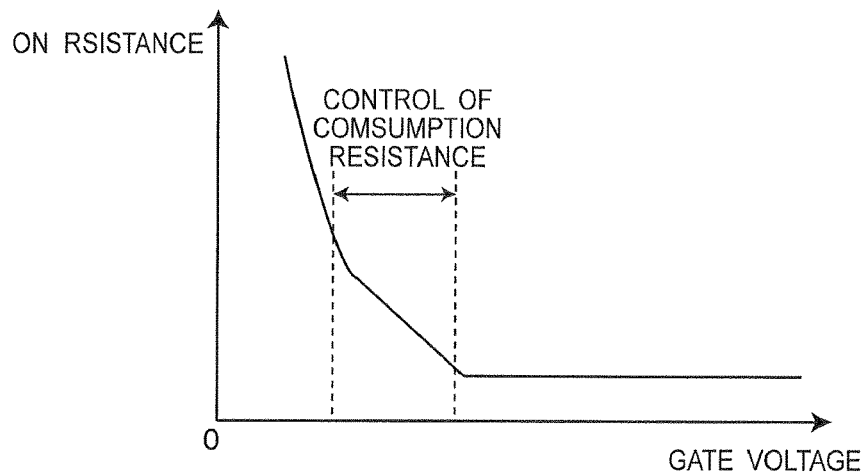
FIG. 9 is a graph showing a relationship between the gate voltage and the on resistance when the switching device S2 in FIG. 7 is a SiC semiconductor made of a semiconductor material containing SiC as a main component.

In addition, when the MOS field effect transistor is a SiC semiconductor device made of a semiconductor material mainly containing SiC, controllability at the time of energy consumption is improved, because the relationship between the gate voltage and the on resistance has a more linear characteristic as shown in FIG. 9 as compared to the characteristic shown in FIG. 8. The device can operate at high temperature, and thus it is possible to consume large energy accumulated in a reactor without any thermal breakdown.

In addition, in the power supply apparatus according to the present embodiment, a current detection unit 50 can detect current flowing in the reactor L1. Consequently, a current command value is prefetched in advance, and when this current command value of the next laser pulse is smaller than that of the previous pulse at the time of driving the laser with pluses, the gate voltage is controlled to obtain the current command value, so that it is possible to follow a current command value at a higher speed even when current command values different from each other for respective pulses are set. Specifically, the LD drive controller 80B reads a machining condition from a CNC apparatus 1 to a memory 82 in advance, and prefetches a current command value from a current command-value readout circuit 83 based on a control signal at the time of driving a laser oscillator 40 with pluses. When the current command value is smaller than that of the previous pulse, the LD drive controller 80B turns on the switching device S2 and controls the switching device S2 using the characteristic (FIG. 8) of the on resistance against the gate voltage of the MOS field effect transistor of the switching device S2 so that energy accumulated in the reactor L1 is consumed until the current command value reaches a predetermined target current value.

For example, the LD circuit 40 used for a laser machining machine requires large drive current. To arrange the switching device S3 in a large current path, the switching device S3 needs to be added in parallel to the LD circuit 40, resulting in a large-scale circuit. With the configuration of the present embodiment, it is only required that the switching device S2 is arranged in parallel to the LD circuit 40, and it is possible to significantly downsize the power supply apparatus as compared to the power supply apparatuses according to the first to third embodiments.

As described above, the fourth embodiment has action and effect similar to those of the first embodiment, and it is possible to significantly downsize the power supply apparatus as compared to the power supply apparatuses according to the first to third embodiments.

Fifth Embodiment

A fifth embodiment is a modified embodiment of the first to fourth embodiments. In the first to fourth embodiments, energy accumulated in a reactor is consumed by the power consuming resistor R1 and the on resistance of a switching device. A power supply apparatus according to the present embodiment has the same configuration as the power supply apparatus for driving an LD shown in FIG. 7, but is different from the power supply apparatus shown in FIG. 7 in a control method.

Figure 10:
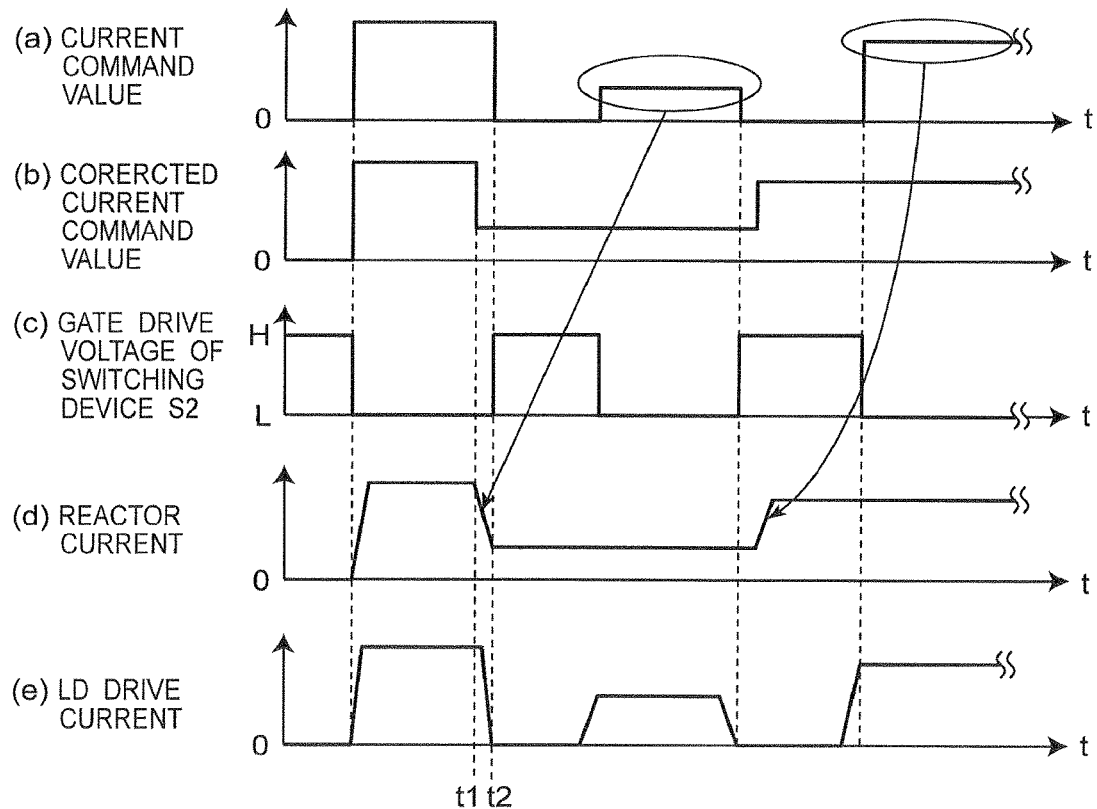
FIG. 10 is a timing chart showing an operation in a case where a current command value is corrected to a current command value of the next pulse immediately before the switching device S2 is turned on in the power supply apparatus for driving an LD in FIG. 7.

According to the present embodiment, a machining condition is read from a CNC apparatus 1 to a memory 82 in a LD drive controller 80 in advance, and when a current command value is smaller than that of the previous pulse at the time of pulse drive, as shown in FIG. 10, the current command value is corrected to the current command value of the next pulse immediately before the switching device S2 turns on (that is, immediately before a beam turns off). A diode load can thus consume the energy accumulated in the reactor when the beam is off and then turn off the beam. Specifically, if the present current command value is outputted until a timing t2, when the current command value for the next machining is found to be small, the current command value is corrected to a target value, that is, the next current command value at a timing t1. A reactor current value thus decreases substantially to the next LD drive current value at the timing t2.

It is thus possible to significantly downsize the power supply apparatus as compared to the power supply apparatuses according to the first to third embodiments. That is, the LD circuit 40 itself operates as a part of energy consumption means 800, and thus the switching device S3 and the power consuming resistor R1 can be eliminated.

Sixth Embodiment

Figure 11:
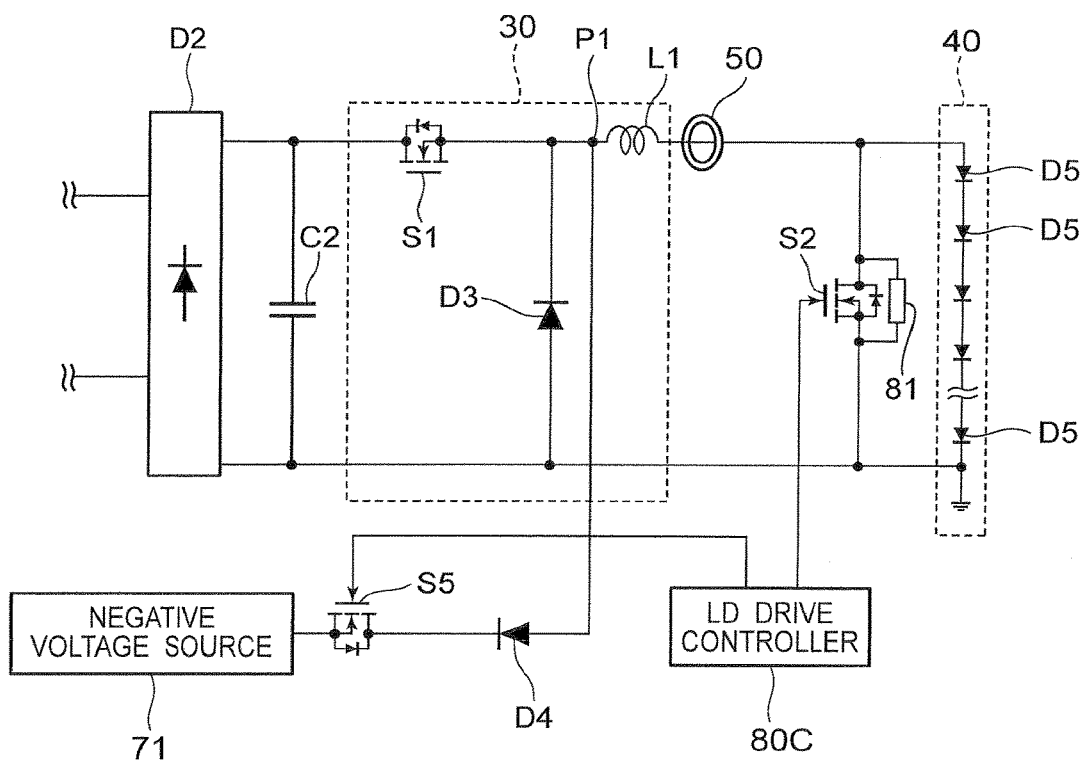
FIG. 11 is a block diagram showing a configuration of a power supply apparatus for driving an LD according to a sixth embodiment of the present invention.

FIG. 11 is a block diagram showing a configuration of a power supply apparatus for driving an LD according to a sixth embodiment of the present invention. The power supply apparatus for driving an LD according to the sixth embodiment is different from the power supply apparatus for driving an LD according to the first embodiment in FIG. 1 in the following points.

(1) The switching device S3 and the power consuming resistor R1 are omitted.

(2) A circuit of a diode D4, a switching device S5, and a negative voltage source 71 is provided at a connection point P1 on a power supply side of a reactor L1.

(3) An LD drive controller 80C that controls on and off of switching devices S2 and S5 is provided instead of the LD drive controller 80.

These differences are described below.

While the load of the power consuming resistor R1 functioning as the energy consumption means 800 consumes energy in the reactor L1 in the first to third embodiments, if the negative voltage source 71 is additionally prepared, it is possible to employ the configuration as shown in FIG. 11. In this case, the energy consumption means 800 includes the negative voltage source 71, the diode D4, and the switching device S5. In FIG. 11, the connection point P1 on the power supply side of the reactor L1 is connected via the diode D4 and the switching device S5 to the negative voltage source 71. In addition, the LD drive controller 80C controls on and off of the switching devices S2 and S5.

According to the configuration shown in FIG. 11, the LD drive controller 80C turns on the switching device S5 and keeps its on-state when a beam is off to regenerate the energy in the reactor L1 via the diode D4 and the switching device S5 to the side of the negative voltage source 71, thus consuming the energy in the reactor L1. In addition, the diode D4 is provided to prevent current from flowing from the negative voltage source 71 into a main circuit including a step-down chopper unit 30 and an LD circuit 40. The configuration according to the present embodiment achieves high power supply efficiency, because power supply loss at the time of a consumption operation is reduced and it is not necessary to arrange the switching device S3 in a current path when a beam is on.

As described above, the sixth embodiment has action and effect similar to those of the first embodiment, and it is possible to significantly downsize the power supply apparatus as compared to the power supply apparatuses according to the first to third embodiments.

According to the power supply apparatus for driving an LD and the control method of the power supply apparatus for driving an LD of the present invention, a circuit that immediately consumes energy accumulated in a reactor is provided, and thus laser power is pulsed at 1 to a few kHz according to machining purposes. Even when currents different from each other for respective pulses are set, it is possible to follow LD drive current at a higher speed. This enables conditions for a laser machining machine to be switched over at a higher speed, thus achieving a short waiting time and improved productivity.

DESCRIPTION OF REFERENCE CHARACTERS

1: COMPUTERIZED NUMERICAL CONTROLLER (CNC APPARATUS)
2: LASER OSCILLATOR
3: INPUT UNIT
5: THREE-PHASE AC POWER SUPPLY
10: INVERTER UNIT
20: STEP-DOWN TRANSFORMER UNIT
30: STEP-DOWN CHOPPER UNIT
40: LASER DIODE (LD)
50: CURRENT DETECTION UNIT
60, 60A: CONSTANT CURRENT CONTROLLER
70: CONSTANT VOLTAGE CONTROLLER
71: NEGATIVE VOLTAGE SOURCE
80, 80A, 80B, 80C: LD DRIVE CONTROLLER
81: SNUBBER CIRCUIT
82: MEMORY
83: CURRENT COMMAND VALUE READOUT CIRCUIT

84: GATE PULSE SIGNAL GENERATING CIRCUIT
800: ENERGY CONSUMPTION MEANS
C1: SMOOTHING CAPACITOR
C2: SMOOTHING CAPACITOR
D1, D2: RECTIFYING UNIT
D3: REFLUX DIODE
D4 to D5: RECTIFYING DIODE
D11 to D34: DIODE
L1: REACTOR
P1: CONNECTION POINT
Q1 to Q4: SWITCHING DEVICE
R1: POWER CONSUMING RESISTOR
S1 to S5: SWITCHING DEVICE

The invention claimed is:

1. A power supply apparatus for driving an LD circuit including a laser diode (LD), the power supply apparatus comprising:
a reactor having one end connected to the LD circuit and another end serially connected to a power supply that supplies power to the LD circuit;
a parallel diode connected parallelly to a serial connection circuit of the LD circuit and the reactor to configure a closed circuit;
a current detector that detects a current flowing in the reactor, and outputs a detection signal indicating a detected current value;
a first switching device that is connected in parallel to the LD circuit and that drives the LD circuit with pulses; and
an energy consumption circuit driven based on a prefetched non-zero current command value and an output of the current detector at a time of driving the LD circuit with pulses, wherein at the time of driving the LD circuit with pulses, when a peak output of a previous pulse by the current detector is larger than the prefetched non-zero current command value, the energy consumption circuit consumes energy accumulated in the reactor until a first time at which the detected current value of the detection signal reaches the prefetched non-zero current command value programmed for the next pulse, the first time being prior to a second time at which the next pulse actually occurs, and when a peak output of a previous pulse by the current detector is smaller than or equal to the prefetched non-zero current command value, the energy consumption circuit does not consume the energy accumulated in the reactor.

2. The power supply apparatus as claimed in claim 1,
wherein the energy consumption circuit is a serial circuit configured by serially connecting a power consuming resistor and a second switching device.

3. The power supply apparatus as claimed in claim 2,
wherein the serial circuit is connected to the LD circuit and the power supply.

4. The power supply apparatus as claimed in claim 2,
wherein the serial circuit is serially connected to the LD circuit and the power supply.

5. The power supply apparatus as claimed in claim 4, further comprising a third switching device that is connected in parallel to the serial circuit.

6. The power supply apparatus as claimed in claim 2,
wherein the LD circuit and the second switching device configure a module.

7. The power supply apparatus as claimed in claim 1,
wherein the energy consumption circuit includes the first switching device, and reduces a gate voltage of the first switching device and increases an on resistance of the first switching device to consume energy accumulated in the reactor.

8. The power supply apparatus as claimed in claim 1,
wherein the energy consumption circuit includes a second switching device having one end connected to a connection point of the reactor and the power supply, and a negative voltage source that is connected to another end of the second switching device, and the energy consumption circuit turns on the second switching device and regenerates energy accumulated in the reactor to the negative voltage source so as to consume the energy.

9. A method for driving an LD circuit including a laser diode (LD), the method comprising the steps of:
detecting, by a current detector, a current flowing in a reactor having one end connected to the LD circuit and another end serially connected to a power supply that supplies power to the LD circuit, and outputting a detecting signal indicating a detected current value;
prefetching a non-zero current command value based on a control signal from a control apparatus when the LD circuit is driven with pulses by a first switching device that is connected in parallel to the LD circuit; and
wherein at the time of driving the LD circuit with pulses, when a peak output of a previous pulse by the current detector is larger than the prefetched non-zero current command value, consuming energy accumulated in the reactor until a first time at which the detected current value of the detection signal reaches the prefetched non-zero current command value of the next beam-on pulse when the prefetched non-zero current command value of the next beam-on pulse is smaller than the detected current value of the detection signal, the first time being prior to a second time at which the next beam-on pulse actually occurs, and when a peak output of a previous pulse by the current detector is smaller than or equal to the prefetched non-zero current command value, avoiding consuming the energy accumulated in the reactor.

* * * * *